US012174278B2

(12) United States Patent
Norris

(10) Patent No.: US 12,174,278 B2
(45) Date of Patent: Dec. 24, 2024

(54) fMRI IMAGING

(71) Applicant: Stichting Radboud Universiteit, Nijmegen (NL)

(72) Inventor: David Norris, Nijmegen (NL)

(73) Assignee: Stichting Radboud Universiteit, Nijmegen (NL)

( * ) Notice: Subject to any disclaimer, the term of this patent is extended or adjusted under 35 U.S.C. 154(b) by 104 days.

(21) Appl. No.: 17/997,636

(22) PCT Filed: May 7, 2021

(86) PCT No.: PCT/NL2021/050299
§ 371 (c)(1),
(2) Date: Oct. 31, 2022

(87) PCT Pub. No.: WO2021/225444
PCT Pub. Date: Nov. 11, 2021

(65) Prior Publication Data
US 2023/0333183 A1    Oct. 19, 2023

Related U.S. Application Data

(60) Provisional application No. 63/021,830, filed on May 8, 2020.

(30) Foreign Application Priority Data

May 8, 2020    (NL) ..................... 2025532

(51) Int. Cl.
*G01V 3/00* (2006.01)
*G01R 33/46* (2006.01)
(Continued)

(52) U.S. Cl.
CPC ..... *G01R 33/4616* (2013.01); *G01R 33/4806* (2013.01); *G01R 33/4828* (2013.01); *G01R 33/5615* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2011/0241667 A1 * 10/2011 Blumich ............... G01R 33/561
324/303
2012/0013336 A1    1/2012 Hetzer et al.
(Continued)

FOREIGN PATENT DOCUMENTS

JP        2002136499 A  *  5/2002
WO    WO-2013115882 A1 *  8/2013    ......... G01R 33/3607
WO        2014197423 A1    12/2014

OTHER PUBLICATIONS

Beckmann et al. "General multilevel linear modeling for group analysis in FMRI." Neuroimage 20.2 (2003): 1052-1063.
(Continued)

*Primary Examiner* — Walter L Lindsay, Jr.
*Assistant Examiner* — Frederick Wenderoth
(74) *Attorney, Agent, or Firm* — Smith Baluch LLP

(57) ABSTRACT

The invention provides a method for performing a magnetic resonance measurement of an element in a target region, wherein the element has a magnetic resonance excitation spectrum peak with a linewidth $L_R$, wherein the method comprises a measurement cycle (100) comprising: a magnetization transfer stage (110) comprising providing a plurality of pulses (115) of first radiation to the target region, wherein the plurality of pulses (115) are selected to provide a net pulse having a net pulse angle $\alpha_N \leq 1°$, and wherein the first radiation comprises a first frequency spectrum peak having a first linewidth $L_F$, wherein the first frequency spectrum peak at least partially overlaps with the magnetic resonance excitation spectrum peak, and wherein $L_F \geq 5*L_R$; an excitation stage (130) comprising providing a radio
(Continued)

frequency pulse to the target region, wherein the radio frequency pulse excites the element resulting in a transverse magnetization of the element; and a measurement stage (140) comprising detecting a signal from the element, wherein the measurement stage (140) is temporally arranged at an echo time TE after the radio frequency pulse, wherein the echo time TE is smaller than a transverse relaxation time of the element in the target region.

18 Claims, 6 Drawing Sheets

(51) Int. Cl.
*G01R 33/48* (2006.01)
*G01R 33/561* (2006.01)

(58) Field of Classification Search
USPC .......................................................... 324/309
See application file for complete search history.

(56) References Cited

U.S. PATENT DOCUMENTS

2016/0202338 A1* 7/2016 Kimura .............. G01R 33/5608
                                                          324/309
2018/0074146 A1    3/2018 Bhat et al.

OTHER PUBLICATIONS

Boer "Magnetization transfer contrast Part 1: MR physics." Medicamundi 40.2 (1995): 64-73.
Chai et al. "Integrated VASO and perfusion contrast: A new tool for laminar functional MRI." NeuroImage 207 (2020): 116358, 13 pages.
Fonov et al. "Unbiased average age-appropriate atlases for pediatric studies." NeuroImage 54.1 (2011): 313-327.
Greve et al. "Accurate and robust brain image alignment using boundary-based registration." NeuroImage 48.1 (2009): 63-72.
Hua et al. "Analysis of on- and off-resonance magnetization transfer techniques." Journal of Magnetic Resonance Imaging 5.1 (1995): 113-120.
Hua et al. "Implementation of vascular-space-occupancy MRI at 7T." Magnetic Resonance in Medicine 69.4 (2013): 1003-1013.
Hua et al. "Magnetization transfer enhanced vascular-space-occupancy (MT-VASO) functional MRI." Magnetic Resonance in Medicine: An Official Journal of the International Society for Magnetic Resonance in Medicine 61.4 (2009): 944-951.
Hua et al. "Whole-brain three-dimensional T2-weighted BOLD functional magnetic resonance imaging at 7 Tesla." Magnetic Resonance in Medicine 72.6 (2014): 1530-1540.
International Search Report and Written Opinion in International Application No. PCT/NL2021/050299 dated Aug. 18, 2021, 14 pages.
Jenkinson et al. "A global optimisation method for robust affine registration of brain images." Medical Image Analysis 5.2 (2001): 143-156.
Jenkinson et al. "Improved optimization for the robust and accurate linear registration and motion correction of brain images." NeuroImage 17.2 (2002): 825-841.
Li et al. "The first step for neuroimaging data analysis: DICOM to NIfTI conversion." Journal of Neuroscience Methods 264 (2016): 47-56.
Lu et al. "Functional magnetic resonance imaging based on changes in vascular space occupancy." Magnetic Resonance in Medicine: An Official Journal of the International Society for Magnetic Resonance in Medicine 50.2 (2003): 263-274.
Pachot-Clouard et al. "Optimization of T2-selective binomial pulses for magnetization transfer." Magnetic Resonance in Medicine 34.3 (1995): 462-469.
Qin et al. "Cerebral blood volume mapping using Fourier-transform-based velocity-selective saturation pulse trains." Magnetic Resonance in Medicine 81.6 (2019): 3544-3554.
Woolrich et al. "Temporal autocorrelation in univariate linear modeling of FMRI data." NeuroImage 14.6 (2001): 1370-1386.

* cited by examiner fMRI IMAGING

CROSS-REFERENCE TO RELATED APPLICATIONS

The present application is a national-phase application, under 35 U.S.C. § 371, of International Application No. PCT/NL2021/050299, filed on May 7, 2021, which in turn claims the priority benefit of Netherlands Application No. 2025532, filed on May 8, 2020, and of U.S. Application No. 63/021,830, also filed on May 8, 2020. Each of these applications is incorporated herein by reference in its entirety for all purposes.

FIELD OF THE INVENTION

The invention relates to a method for performing a magnetic resonance measurement. The invention further relates to a system for performing a magnetic resonance measurement. The invention further relates to a computer program product. The invention further relates to a data carrier.

BACKGROUND OF THE INVENTION

Methods for magnetic resonance imaging are known in the art. For instance, Kim and Kim, "Quantification of cerebral arterial blood volume and cerebral blood flow using MRI with modulation of tissue and vessel (MOTIVE) signals" describes quantitatively measuring regional cerebral arterial blood volume and blood flow by modulation of tissue and vessel signals. The tissue signal is selectively modulated using magnetization transfer effects. The blood signal is changed either by injection of a contrast agent or by arterial spin labeling.

WO2014197423A1 describes an acquisition scheme for T2-weighted BOLD fMRI. It employs a T2 preparation module to induce the BOLD contrast, followed by a single-shot 3D fast gradient echo (GRE) readout with short echo time (TE<2 ms). It describes that the separation of BOLD contrast generation from the readout substantially reduces the "dead time" due to long TE required in spin echo (SE) BOLD sequences.

US2018074146A1 describes a method and imaging apparatus for acquiring multi-contrast magnetic resonance (MR) data, wherein a data acquisition scanner is operated in a simultaneous multislice data acquisition sequence to radiate at least one single-band binomial radio-frequency (RF) pulse, that excites fat protons in at least some slices of an examination subject from which MR raw data are to be acquired simultaneously, and leaving water in a longitudinal plane for those at least some slices, and leaving all spin species in a longitudinal plane in others of the slices that are to be acquired simultaneously. A spoiler gradient is subsequently activated that dephases the fat protons that were excited. The scanner is then operated to execute an MR data acquisition sequence with excitation by radiation of multi-band RF pulses.

US2012013336A1 describes a method of magnetic resonance imaging of an object comprising the steps of arranging the object in a stationary magnetic field, subjecting the object to an excitation and encoding sequence of magnetic field gradients resulting in k-space sampling in two segments along the phase encoding direction, wherein the encoding sequence of the magnetic field gradients is selected such that the two segments in k-space are sampled along trajectories beginning with a central k-space line through the k-space center and continuing to opposite k-space borders of the two segments, collecting magnetic resonance signals created in the object, and reconstructing an image of the object based on the magnetic resonance signals, wherein one central k-space line is sampled in both of the two k-space segments, and intersegment phase and/or intensity deviations are corrected in both k-space segments using the magnetic resonance signals collected along the central k-space line.

Hua et al., "Whole-brain three-dimensional T2-weighted BOLD functional magnetic resonance imaging at 7 Tesla", 2013, Magnetic Resonance in Medicine, describes a T2-preparation module to induce blood-oxygenation-level-dependent (BOLD) contrast, followed by a single-shot three-dimensional (3D) fast gradient-echo readout with short echo time (TE).

Qin et al., "Cerebral blood volume mapping using Fourier-transform-based velocity-selective saturation pulse trains", 2018, Magnetic Resonance in Medicine, describes a comparison of Fourier-transform-based velocity-selective saturation (FT-VS S) pulse trains with flow-dephasing VSS techniques for CBV quantification.

Hua et al., "Implementation of vascular-space-occupancy MRI at 7T", 2012, Magnetic Resonance in Medicine, describes a magnetization-transfer-enhanced-VASO approach applied to maximize tissue-blood signal difference. Second, a 3D fast gradient-echo sequence with low flip-angle (7°) and short echo-time (1.8 ms) was used to minimize the BOLD effect and to reduce image distortion and power deposition. Finally, a magnetization-reset technique was combined with a motion-sensitized-driven-equilibrium approach to suppress three types of non-steady-state spins.

SUMMARY OF THE INVENTION

Brain activation studies conducted using functional magnetic resonance imaging (fMRI) contributed to our understanding of the biological underpinnings of human cognition and behavior, as well as provided a broader societal impact ranging from pre-operative planning, diagnosis and understanding of mental illnesses and neurological disorders. fMRI typically utilizes the blood oxygenation level dependent (BOLD) contrast mechanism, which may depend on three physiological parameters: the cerebral metabolic rate of oxygen consumption, the cerebral blood flow (CBF), and the cerebral blood volume (CBV). Upon activation of a brain region all three parameters increase in value, and the net effect may be a decrease in deoxyhaemoglobin concentration, together with a corresponding increase in the transverse relaxation time. This may be due to the dominant effect of the increase in CBF, a phenomenon known as functional hyperaemia. The underlying hyperaemic mechanism may be that excitatory neurotransmission may lead to the release of vasodilatory substances that relax the smooth muscles at the walls of the arterioles, reducing vascular resistance. Although the smooth muscle tension may be important for the modulation of blood flow, the action of pericytes on the capillary endothelium may also lead to dilation of the capillaries. These physiological changes may lead to an increase in both CBF and CBV.

Functional brain imaging in humans may typically be performed using blood oxygenation level dependent (BOLD) contrast, which may require a period of tens of milliseconds after excitation of a spin system to achieve maximum contrast, which may lead to inefficient use of acquisition time, reduced image quality and inhomogeneous sensitivity throughout the cortex. BOLD-contrast changes may typically be measured using MRI pulse sequences that are sensitive to changes in transverse relaxation times, most commonly with a gradient-echo (GE) sequence, sensitized to T2* and less commonly with a spin-echo (SE) sequence sensitized to T2. For sensitivity, the echo time (TE) is generally matched with the relevant transverse relaxation time of the studied tissue. However, with regards to T2*-weighted acquisitions there may be several disadvantages: first, the relatively long TE limits the efficiency, reduces the signal intensity by a factor of about 1/e and makes the method prone to artefacts, particularly signal dropout in regions of poor static main field homogeneity. Second, reliance on changes in deoxyhaemoglobin concentration in the capillaries and post-capillary vessels has the consequence that the measured activation will always be downstream of the underlying neuronal activity.

The prior art may further describe cerebral blood flow measurements using arterial spin labelling. Such measurements may, however, be undesirable as they require labelling, and may require measuring both control and label images, and may therefore to date not have been widely used for functional neuroimaging in humans.

The prior art may further describe the use of lengthy off-resonance radio frequency signals to achieve magnetization transfer (MT) for creating signal differences between tissue and blood compartments.

The prior art may further describe selecting a sufficiently long echo time (TE) to generate a bold contrast, and/or to attenuate a venous signal.

Hence, it is an aspect of the invention to provide an alternative method for performing a magnetic resonance measurement, which preferably further at least partly obviates one or more of above-described drawbacks. The present invention may have as object to overcome or ameliorate at least one of the disadvantages of the prior art, or to provide a useful alternative.

Hence, in a first aspect, the invention provides a method for performing a magnetic resonance measurement of an element in a target region. Especially, (in the target region) the element may have a magnetic resonance excitation spectrum peak with a linewidth $L_R$, especially a full width half maximum (FWHM) linewidth $L_R$. In particular, the magnetic resonance excitation spectrum peak may comprise the Larmor frequency $\omega_L$, especially the centre of the magnetic resonance excitation spectrum peak may essentially correspond to the Larmor frequency $\omega_L$. In embodiments, the method may comprise a measurement cycle comprising a magnetization transfer stage, an excitation stage, and a measurement stage. The magnetization transfer stage may comprise providing a plurality of (successive) pulses of first radiation to the target region, especially wherein the plurality of pulses are selected to provide a net pulse (to the element) having a net pulse angle (also: "flip angle") $\alpha_N \leq 1°$. The first radiation may especially comprise a first frequency spectrum peak having a first linewidth $L_F$, especially wherein the first frequency spectrum peak at least partially overlaps with the magnetic resonance excitation spectrum peak, and especially wherein $L_F \geq 5*L_R$. The excitation stage may comprise providing a radio frequency (also "RF") pulse to the target region, especially wherein the radio frequency pulse (is selected to) excite(s) the element resulting in a transverse magnetization of the element. The excitation stage may especially be temporally arranged after the magnetization transfer stage. The measurement stage may comprise detecting a signal from the element, wherein the measurement stage is temporally arranged at an echo time TE after the radio frequency pulse, especially wherein the echo time TE is smaller than a transverse relaxation time T2 (also: "spin-spin relaxation time T2") of the element in the target region, especially smaller than an observed transverse relaxation time T2* (or: "effective transverse relaxation time T2*") of the element in the target region. In particular, the observed transverse relaxation time may correspond to the amount of time after the radio frequency pulse where the transverse magnetization of the element drops to 37% of the magnitude directly after the radio frequency pulse.

The method of the invention may provide the benefit that a magnetic resonance measurement may be performed with both increased efficiency, by eliminating the need for lengthy off-resonance pulses, and increased sensitivity to changes in (blood) volume, as this may be greatest at TE=0, i.e., typically a long echo time is selected for BOLD measurements to improve the functional contrast, but this may also result in a reduced signal/noise ratio. As the magnetization transfer may (preferentially) suppress the signal from a first compartment, a change in relative compartment size, such as a volume increase of the second compartment may be detected, especially at a short TE as the distinction between the compartments does not rely (substantially) on a difference in transverse relaxation time of the different compartments, as may be the case for prior art methods. In particular, with regards to fMRI, by suppressing the signal from parenchyma, an increase in blood volume, such as due to localized brain activation, may result in an increased total signal, which may be beneficially observed at short TE. Similarly, an increase in blood oxygenation level (within capillaries) may result in an increased total signal. Hence, with regards to fMRI, the method of the invention may involve the use of magnetization transfer to obtain a signal that varies with a level of functional activation.

Further, the method of the invention may facilitate measuring closer to the region of brain activation as it may not depend on detecting a downstream decrease in deoxyhemoglobin concentration. In addition, the signal may be better related to underlying neuronal activity. BOLD measurements may rely on changes in T2* which is an MRI parameter and can vary throughout the brain. In particular, the method of the invention facilitates observing a change in blood volume, which is a physiological parameter which may be more easily related to neuronal activity; and the location of the observed change may be more representative, especially due to being physically closer to the source of neuronal activity, than, for example, BOLD which shows also downstream signal.

Hence, in specific embodiments, the invention provides a method for performing a magnetic resonance measurement of an element in a target region, wherein the element has a magnetic resonance excitation spectrum peak (or: "signal in a magnetic resonance excitation spectrum") with a linewidth $L_R$. In particular, the element may have a magnetic resonance excitation spectrum with a peak (or "signal") at the Larmor frequency of the element with a full width half maximum linewidth $L_R$. In particular, the method may comprise a measurement cycle comprising: a magnetization transfer stage comprising providing a plurality of pulses of first radiation to the target region, wherein the plurality of pulses are selected to provide a net pulse having a net pulse angle $\alpha_N \leq 1°$, and wherein the first radiation comprises a first frequency spectrum peak having a first linewidth $L_F$, wherein the first frequency spectrum peak at least partially overlaps with the magnetic resonance excitation spectrum peak, and wherein $L_F \geq 5*L_R$; an excitation stage comprising providing a radio frequency pulse to the target region, wherein the radio frequency pulse excites the element resulting in a transverse magnetization of the element; and a measurement stage comprising detecting a signal from the element, wherein the measurement stage is temporally arranged at an echo time TE after the radio frequency pulse, wherein the echo time TE is smaller than a transverse relaxation time of the element in the target region.

Hence, in embodiments, the invention provides a method for performing a magnetic resonance measurement of an element in a target region.

The term "element" may herein refer to any element having a non-zero spin. In embodiments, the element may especially comprise hydrogen. The term "element" may especially refer to a plurality of (same) elements.

The term "target region" may herein refer to a region that is to be measured. In particular, in embodiments, the target region may comprise a part of an animal, such as a human, especially a brain of an animal, more especially a slice of a brain. In particular, in fMRI it may be common to measure brain slices. In further embodiments, the target region may, for example, comprise a plant part, such as a seed, or a food item, especially a plant part, or especially a food item.

In particular, the target region may comprise a first compartment and a second compartment, especially wherein it may be advantageous to suppress a signal from the first compartment in order to increase contrast between the first compartment and the second compartment. For example, in specific embodiments, the first compartment may comprise a non-blood tissue, whereas the second compartment may comprise blood (tissue).

The element may (in the target region) have a Larmor frequency $\omega_L$, which is the frequency at which magnetic resonance (of the element) can be excited. The Larmor frequency $\omega_L$ may be proportional to a magnetic field the element is exposed to according to:

$$\omega_0 = \gamma B_0$$

wherein $\gamma$ is the gyromagnetic ratio, which may be specific to the element, and $B_0$ is the magnetic induction field. For example, for hydrogen, the gyromagnetic ratio $\gamma$ may be about 42.58 MHz/T. Hence, the target region may comprise (same) elements with (slightly) different Larmor frequencies $\omega_L$ as they may experience a different magnetic induction field.

In practice, the magnetic resonance of the element may be perturbed at the Larmor frequency $\omega_L$ and—to a lesser extent—at frequencies close to the Larmor frequency, i.e., the Larmor frequency $\omega_L$ may (roughly) correspond to a peak in an absorption spectrum of the element. Hence, the element may have a magnetic resonance excitation spectrum peak (also: "magnetic resonance excitation frequency distribution"), which may indicate the absorption at different frequencies at which magnetic resonance of the element can be excited. The magnetic resonance excitation spectrum peak may especially comprise a peak at the Larmor frequency $\omega_L$. In particular, the magnetic resonance excitation spectrum peak may be characterized with a linewidth $L_R$, especially wherein linewidth $L_R$ corresponds to a full width half maximum (FWHM) of the magnetic resonance excitation spectrum peak.

The method may especially comprise a measurement cycle comprising a magnetization transfer stage, an excitation stage, and a measurement stage.

Hence, in embodiments, the method, especially the measurement cycle, may comprise a magnetization transfer stage. The magnetization transfer stage may comprise suppressing magnetization of the element in a first compartment to increase contrast between the first compartment and a second compartment.

In particular, the magnetization transfer stage may comprise providing a plurality of (successive) pulses of first radiation to the target region. The plurality of pulses may especially comprise non-selective binomial RF pulses, such as in the proportions $\pm 1/\mp 2/\pm 1$, more especially two (or more) non-selective binomial RF pulses of opposite phases and magnitudes, such as in the proportions $\pm 1/\mp 2/\pm 1$. The application of two (or more) binomial pulses back to back with inverse phase may beneficially reduce on-resonance signal attenuation which could, for example, be related to transmission of amplitude errors or off-resonance effects due to static background field inhomogeneity.

The first radiation may especially comprise a radio frequency, i.e., the plurality of pulses may comprise radio frequency pulses.

The plurality of pulses may especially have a pulse duration of at least 0.5 ms, such as at least 0.75 ms, especially at least 1 ms, such as at least 1.5 ms. In further embodiments, the plurality of pulses may especially have a pulse duration of at least 3 ms, such as at least 5 ms, especially at least 6 ms, such as at least 7 ms. In further embodiments, the plurality of pulses may especially have a pulse duration of at most 3 ms, such as at most 2 ms, especially at most 1.5 ms, such as at most 1 ms. In further embodiments, the plurality of pulses may especially have a pulse duration of at most 15 ms, such as at most 12 ms, especially at most 10 ms, such as at most 7 ms.

In further embodiments, individual pulses of the plurality of pulses may have individual pulse durations of at least 0.15 ms, such as at least 0.2 ms, especially at least 0.25 ms.

In embodiments, the plurality of pulses may comprise a (single) binomial RF pulse.

In further embodiments, the plurality of pulses may comprise two (or more) non-selective binomial RF pulses, especially of opposite phases and magnitudes. In such embodiments, each non-selective binomial RF pulse may have a pulse duration of at least 0.5 ms, such as at least 0.75 ms, especially at least 1 ms, such as at least 1.5 ms. In further embodiments, each non-selective binomial RF pulse may have a pulse duration of at least 3 ms, such as at least 5 ms, especially at least 6 ms, such as at least 7 ms. In further embodiments, each non-selective binomial RF pulse may have a pulse duration of at most 3 ms, such as at most 2 ms, especially at most 1.5 ms, such as at most 1 ms. In further embodiments, each non-selective binomial RF pulse may especially have a pulse duration of at most 15 ms, such as at most 12 ms, especially at most 10 ms, such as at most 7 ms.

The plurality of pulses may especially be selected to provide a net pulse having a net pulse angle $\alpha_N \leq 5°$, such as $\leq 3°$, especially $\leq 2°$, such as $\leq 1°$, especially $\leq 0.5°$, such as $\leq 0.1°$, especially $\leq 0.05°$, such as $\leq 0.01°$, including $0°$. In particular, it may be preferable to provide a net pulse angle of $0°$, or as close to $0°$ as possible. In particular, if the pulse is non-zero then direct saturation may increase, which may be undesirable. It will be clear to the person skilled in the art that due to, for example, imperfections in the instrumentation a theoretically $0°$ net pulse may deviate somewhat from zero in practice.

In further embodiments, at least two (sub-pulses), especially all sub-pulses, of the plurality of pulses may provide a pulse having a pulse angle $\geq 5°$, such as $\geq 15°$, especially $\geq 30°$, such as $\geq 60$, especially $\geq 90°$. In further embodiments, at least two (sub-pulses) of the plurality of pulses may provide a pulse having a pulse angle ≤180°, such as ≤90°, especially ≤45°, such as ≤30. It will be clear to the person skilled in the art that in principle there may be no upper limit to the pulse angle selected for (individual) sub-pulses.

With regards to individual pulses of the plurality of (sub)-pulses, it may be preferable to provide (sub)-pulses with a larger power. In particular, the greater the power, the greater the MT effect, so having a short high flip angle pulse may be more effective than a longer pulse with the same flip angle. However, a large power may imply a higher power deposition (heating), which may be undesirable.

The (total) pulse power that may be provided in the magnetization transfer stage may be selected in view of specific absorption rate guidelines, which may vary between different jurisdictions. For example, in embodiments, the (total) pulse power that may be provided in the magnetization transfer stage may be selected from the range of 2 W/kg-20 W/kg, wherein the weight refers to the mass exposed to the plurality of pulses. For example, in embodiments, a human head of about 5 kg may be exposed to the plurality of pulses, and a (total) pulse power of 10 W may be selected, such as over a 10-minute period. The person skilled in the art will be capable of selecting suitable (total) pulse powers and durations, in view of both the desired magnetization transfer and the (local) safety guidelines.

In embodiments, the (total) pulse power that may be provided in the magnetization transfer stage may be at least 2 W/kg, such as at least 2.5 W/kg, especially at least 3 W/kg. In further embodiments, the (total) pulse power that may be provided in the magnetization transfer stage may be at least 4 W/kg, such as at least 5 W/kg, especially at least 7 W/kg. In further embodiments, the (total) pulse power that may be provided in the magnetization transfer stage may be at most 20 W/kg, such as at most 18 W/kg, especially at most 15 W/kg. In further embodiments, the (total) pulse power that may be provided in the magnetization transfer stage may be at most 12 W/kg, such as at most 10 W/kg, especially at most 8 W/kg. In further embodiments, the (total) pulse power that may be provided in the magnetization transfer stage may be at most 5 W/kg, such as at most 4 W/kg, especially at most 3 W/kg. In further embodiments, the (total) pulse power provided in the magnetization transfer stage may be the maximum value according to the (local) safety guidelines.

In embodiments, the (total) pulse power that may be provided in the magnetization transfer stage is selected from the range of 1.5-4 W/kg, such as from the range of 1.5-3.5 W/kg, especially from the range of 2-3 W/kg.

In general, in practice, the (total) pulse power that may be provided may be selected to maximize a contrast obtained due to magnetization transfer, while remaining within the appropriate safety limits.

The first radiation may especially comprise a first frequency spectrum peak. The first frequency spectrum peak may especially at least partially overlap with the magnetic resonance excitation spectrum peak. In particular, the first frequency spectrum peak may at least partially overlap with the frequencies corresponding to the frequency range defined by the FWHM linewidth of the magnetic resonance excitation spectrum peak. Especially, the first frequency spectrum peak may comprise the frequency range defined by the FWHM linewidth of the magnetic resonance excitation spectrum peak. In further embodiments, the first frequency spectrum peak may essentially be centered at the Larmor frequency $\omega_L$ of the element (in the target region).

The first frequency spectrum peak may especially have a first linewidth $L_F$, especially wherein $L_F \geq 2*L_R$, such as $\geq 3*L_R$, especially $\geq 5*L_R$, such as $\geq 8*L_R$, especially $\geq 10*L_R$ such as $\geq 15*L_R$, especially $\geq 20*L_R$. Hence, the first frequency spectrum peak may be substantially broader than the magnetic resonance spectrum. Thereby, the magnetization transfer effect may have a similar efficiency throughout the object and may be largely unaffected by local variations in the Larmor frequency.

It will be clear to the person skilled in the art that the excitation ranges may vary with the strength of an imposed static magnetic field. Hence, the first frequency spectrum peak may be selected based, among others, on the strength of an imposed static magnetic field. For example, in embodiments, the radio frequency pulse may comprise a frequency $f_1$, wherein $f_1$ is selected from the range of $\omega_L-100$ kHz-$\omega_L+100$ kHz, such as from the range of $\omega_L-50$ kHz-$\omega_L+50$ kHz, especially from the range of $\omega_L-10$ kHz-$\omega_L+10$ kHz.

The magnetization transfer stage may result in selective perturbation, especially selective saturation, of the element in the second compartment in the target region. In particular, with regards to fMRI, magnetization transfer may predominantly occur in a second compartment comprising macromolecules, for example due to macromolecules exchanging water molecules with their direct environment. In particular, the magnetization transfer may be faster than the magnetization pulses, which may cause the elements in the second compartment to not revert to the original condition after the plurality of pulses, whereas the elements in the first compartment may essentially revert to the original condition. Hence, thereby the magnetization transfer stage may selectively saturate the second compartment, resulting in an increased contrast between the second compartment and the first compartment. In particular, the goal of the magnetization transfer stage may be to (maximally) irradiate a bound pool of the element, such as hydrogen in (macromolecules in) non-blood tissue, while having minimal effect on the free pool, such as hydrogen in water.

In embodiments, the method, especially the measurement cycle, may comprise an excitation stage. The excitation stage may comprise providing a radio frequency pulse to the target region, especially wherein the radio frequency pulse excites the element, especially resulting in a transverse magnetization of the element. Hence, the (frequency of the) radio frequency pulse may be selected suitable to excite the element, especially to cause a transverse magnetization of the element. In particular, the radio frequency pulse may (be selected to) provide a net flip angle $\alpha_F$ to the element, wherein $\alpha_F$ is selected from the range of 1°-90°. In particular, the radio frequency pulse may (be selected to) provide a net flip angle $\alpha_F$ to the element of at most 90°. In specific embodiments, the radio frequency pulse may (be selected to) provide a net flip angle $\alpha_F$ of (essentially) 90°. In further embodiments, the net flip angle $\alpha_F$ may be the Ernst angle. In particular, the net flip angle $\alpha_F$ may be the Ernst angle of arterial blood or of grey matter, especially of arterial blood.

In further embodiments, the radio frequency pulse may comprise a radio frequency spectrum peak. The radio frequency spectrum peak may especially at least partially overlap with the (local) magnetic resonance excitation spectrum peak. It will be clear to the person skilled in the art that the (local) magnetic resonance excitation spectrum peak may be shifted and broadened due to an imposed magnetic field (gradient). In particular, a magnetic field gradient may be imposed onto the target region (also see below), such as a magnetic field gradient imposed onto a brain slice, which may result in a shift of the (local) magnetic resonance excitation spectrum peak. For example, the local magnetic resonance excitation spectrum peak may be shifted by several kHz, such as tens of kHz, from the magnetic resonance excitation spectrum peak due to the magnetic field gradients. Thereby, in embodiments, the radio frequency spectrum peak may also determine the slice (or slab) of a brain that is excited.

In general, the radio frequency spectrum peak may be substantially broader than the magnetic resonance spectrum.

In embodiments, the radio frequency pulse may comprise a frequency $f_2$, wherein frequency $f_2$ has a frequency offset suitable to excite a target region, such as a slice or slab, of spins when a magnetic field gradient is applied simultaneously with the radio frequency pulse, and the radio frequency pulse may have a bandwidth matched to the physical dimension of the target region, especially the desired slice or slab.

For example, in embodiments, the radio frequency pulse may comprise a frequency $f_2$, wherein $f_2$ is selected from the range of $\omega_L-100$ kHz–$\omega_L+100$ kHz, such as from the range of $\omega_L-50$ kHz–$\omega_L+50$ kHz, especially from the range of $\omega_L-10$ kHz–$\omega_L+10$ kHz.

Hence, the excitation stage may excite the element to generate a transverse magnetization state. After cession of the excitation stage, the element magnetization (population) may decay according to the observed transverse relaxation time ($T2^*=1/R2^*$) comprising the spin-spin relaxation ($T2=1/R2$) and an additional reversible component ($T2'=1/R2'$) arising from inhomogeneities in the static magnetic field such that $R2^*=R2+R2'$. The signal will have a $T2^*$-weighting, unless additional radio-frequency pulses are used to reverse the effect of the $T2'$ contribution, in which case the signal will have a $T2$-weighting. In particular, the rates of $T2^*$- and $T2$-relaxation may differ for different compartments, such as for different tissues. With regards to fMRI measurements, a measurement may typically be performed after a specific time corresponding to a 63% decay of the $T2^*$ or $T2$-weighted signal. In particular, fMRI measurements are mostly $T2^*$-weighted, that is measuring when 63% of the transverse magnetization has decayed, without reversing the effects of $T2'$, or $T2$-weighted, that is measuring with additional radio frequency pulses to reverse the effects of $T2'$.

In embodiments, the method, especially the measurement cycle may further comprise a measurement stage. The measurement stage may comprise detecting a signal from the element. In particular, the detected signal may be a voltage elicited in a receiver coil due to the rotating transverse magnetization. In further embodiments, the measurement stage may be temporally arranged at an echo time TE after the radio frequency pulse, especially wherein the echo time TE is smaller than a transverse relaxation time, especially a transverse relaxation time $T2$, or especially an observed transverse relaxation time $T2^*$, of the element (in the target region).

In further embodiments, the echo time TE$\leq 0.99*T2$, such as $\leq 0.98*T2$, especially $\leq 0.95*T2$, such as $\leq 0.9*T2$, such as $\leq 0.8*T2$. In further embodiments, the echo time TE$\leq 40$ ms, such as $\leq 36$ ms. In further embodiments, the echo time TE$\leq 30$ ms, such as $\leq 25$ ms, especially $\leq 20$ ms, such as $\leq 15$ ms, especially $\leq 10$ ms, such as $\leq 5$ ms, especially $\leq 2$ ms, such as $\leq 1$ ms, including 0 ms.

In particular, T2 may be the transverse relaxation time at which the transverse magnetization of the element in the target region drops to 37% determined based on the decay of transverse magnetization arising from natural interactions at the atomic or molecular levels, especially with respect to the magnetization status at the end of the excitation stage.

In further embodiments, the echo time TE$\leq 0.99*T2^*$, such as $\leq 0.98*T2^*$, especially $\leq 0.95*T2^*$, such as $\leq 0.9*T2^*$, such as $\leq 0.8*T2^*$. In further embodiments, the echo time TE$\leq 30$ ms, such as $\leq 25$ ms, especially $\leq 20$ ms, such as $\leq 15$ ms, especially $\leq 10$ ms, such as $\leq 5$ ms, especially $\leq 2$ ms, such as $\leq 1$ ms, including 0 ms.

In further embodiments, the echo time TE$\geq 0$ ms, such as $\geq 1$ ms, especially $\geq 2$ MS.

In particular, T2* may be the observed transverse relaxation time at which the transverse magnetization of the element in the target region drops to 37%, especially with respect to the magnetization status at the end of the excitation stage. T2* may be shorter than T2 as a result of inhomogeneities in the magnetic field, for example due to distortions in the field produced by differing magnetic susceptibilities of tissue.

Hence, the measurement stage may be temporally arranged after the excitation stage.

In embodiments, the magnetization transfer stage may be temporally arranged prior to the excitation stage, i.e., the excitation stage may be temporally arranged after the magnetization transfer stage. This may provide the benefit that the MT pulses do not interfere with the imaging procedure.

In further embodiments, the magnetization transfer stage may coincide temporally with the excitation stage. In particular, this may be possible as the excitation angle of an RF pulse may be given by the integral of a radiofrequency field over time, but the MT effect may be proportional to the square of the field integrated over time. Hence, by reducing the RF pulse duration but keeping the same excitation angle the MT effect can be increased. However, it may generally be preferred to temporally arrange the excitation stage after the magnetization transfer stage.

In further embodiments, the magnetization transfer stage may be temporally arranged between the excitation stage and the measurement stage. This may be particularly efficient with regards to duration of the measurement, as the magnetization transfer stage is arranged to coincide with the waiting for echo time TE after the excitation stage and before measuring.

In embodiments, the method may further comprise a gradient spoiler stage, comprising imposing a (pseudo-random) gradient spoiler scheme (also "crusher gradient scheme") onto the target region. The gradient spoiler may be used to spoil any signal 'accidentally' generated by the MT pulses, e.g., when the net pulse is non-zero. Hence, a gradient spoiler stage may be executed to reduce, especially avoid, image artefacts.

In embodiments, the method may comprise a plurality of (consecutive) measurement cycles. In general, each measurement cycle comprises at least a (respective) excitation stage and a (respective) measurement stage.

However, in such embodiments, two or more measurement cycles may share a single magnetization transfer stage, i.e., it may not be necessary to perform a magnetization transfer stage for each set of excitation stage and measurement stage. Thereby, the method may be more efficient with regards to time. For example, in further embodiments, the method may comprise a plurality of (consecutive) measurement cycles, wherein one out of two, especially one of three, more especially one out of four, measurement cycles comprise a magnetization transfer stage. In particular, every second, especially every third, more especially every fourth, measurement cycle may comprise a magnetization transfer stage.

In further embodiments, each measurement cycle may comprise a magnetization transfer stage. This may provide the benefit that the measurement cycles may be more consistent, i.e., that there may be a reduced variation between successive measurement cycles due to the time since the last magnetization transfer stage.

In embodiments, the method may comprise imposing a main magnetic field onto the target region. The main magnetic field may have a magnetic flux density selected from the range of 0.2-14 T, especially from the range of 1.5-7 T. In further embodiments, the main magnetic field may have a magnetic flux density of at least 0.2 T, such as at least 0.3 T, especially at least 0.5 T, such as at least 1 T, especially at least 2 T, such as at least 3 T. In further embodiments, the main magnetic field may have a magnetic flux density of at most 10 T, such as at most 7 T, especially at most 5 T, such as at most 3 T, especially at most 2 T, such as at most 1 T.

In further embodiments, the method may comprise superimposing magnetic field gradients onto the main magnetic field. Thereby, the target region may be divided into voxels experiencing different (local) magnetic fields. In further embodiments, the magnetic field gradients may have independently selected magnetic flux density gradients of at most 300 mT/m, such as at most 100 mT/m, especially at most 50 mT/m, such as at most 10 mT/m, especially at most 1 mT/m. In further embodiments, the magnetic field gradients may have independently selected magnetic flux densities of at least 0.1 mT/m, such as at least 0.1 mT/m, especially at least 1 mT/m, such as at least 10 mT/m, especially at least 50 mT/m.

In embodiments, the excitation stage may comprise providing a second radio frequency pulse to the target region. In particular, the excitation stage may comprise providing the second radio frequency pulse at a time $T_S$ after the (first) radio frequency pulse, wherein $T_s$ is about 0.5*TE, especially wherein $T_S$ is selected from the range of 0.4*TE-0.6*TE, such as especially 0.5*TE. The second radio frequency pulse may especially be (essentially) a 180° pulse with respect to the (first) radio frequency pulse. In particular, the second radio frequency pulse will reverse the signal decay characterized by T2'.

Such embodiments may be particularly beneficial for embodiments wherein TE is smaller than a transverse relaxation time T2 of the element in the target region.

In specific embodiments, the element may comprise hydrogen, and the target region may comprise an animal brain, especially a human brain. In further embodiments, the target region may comprise a (part of a) brain of an animal (or "human"), such as a brain slice or a brain slab, i.e., the target region may comprise an animal (or "human") brain slice, or an animal (or "human") brain slab. In embodiments, the animal may especially be a human. In particular, in embodiments, the method may be a method for measuring brain activity. Further, in embodiments, the method may be an fMRI method.

The method may be particularly suitable to study the neurological response of the animal (brain) to a stimulus, for example for research.

Hence, in embodiments, the method may comprise subjecting the animal to a stimulus, especially wherein the stimulus is selected from the group comprising food, a drug, an image, a task, such as an exercise, and a tactile stimulus, especially preceding and/or during at least part of the measurement cycle, more especially preceding (at least part of) the measurement cycle, or more especially during (at least part of) the measurement cycle.

In further embodiments, the brain may be at rest, i.e., the brain (or: "the animal") are not being actively stimulated.

In specific embodiments, the method may be for measuring, especially localizing, a blood volume change in a target region. In embodiments wherein the target region comprises a (part of a) brain, a blood volume change may be indicative of neurological activity.

Hence, in embodiments, the method may further comprise an analysis stage, wherein the analysis stage comprises localizing neuronal activity in the brain based on the signal, especially by measuring a blood volume change in the target region. In further embodiments, the analysis stage may comprise localizing neuronal activity in the brain based on a plurality of signals, especially a plurality of signals of a plurality of (successive) measurement cycles.

In further embodiments, the analysis stage may comprise determining the effect of the stimulus, especially the effect of the stimulus on the neuronal activity.

The method may further be informative of a beneficial action to subject the animal to. For example, in specific embodiments, the method may be a diagnostic method, and the results of the method may suggest a specific follow-up treatment.

Hence, in further embodiments, the method, especially the analysis stage, may comprise subjecting the animal to a follow-up action based on the localized neuronal activity, especially wherein the follow-up action is selected from the group comprising following a diet, a drug regime, an exercise regime and a medical treatment (regime).

In further embodiments, the method, especially the analysis stage, may comprise identifying an eloquent area in the brain, especially an area active during specific stimuli. In particular, the identification of eloquent areas may be informative regarding which areas of the brain are important for particular activities. Such information may be used, for example, for treatment planning, such as for the planning of a brain surgery (areas to avoid excising).

In further embodiments, the method may be a non-medical method. In further embodiments, the method may be a non-diagnostic method.

In a second aspect, the invention may further provide a system for performing a magnetic resonance measurement of an element in a target region, especially a target region of a measurement subject. The system may comprise a pulse generator, a control system, a sensor, and a measurement site. The measurement site may especially be configured for hosting the measurement subject. In an operational mode the system, especially the control system, may be configured to execute a measurement cycle. The measurement cycle may comprise a magnetization transfer stage, an excitation stage and a measurement stage. In the magnetization transfer stage the pulse generator may provide a plurality of (successive) pulses of first radiation to the target region. The plurality of pulses may be selected to provide a net pulse having a net pulse angle $\alpha_N \leq 1°$. In embodiments, the first radiation may comprise a first frequency spectrum peak having a first width $L_F$, especially wherein the first frequency spectrum peak at least partially overlaps with a magnetic resonance excitation spectrum peak of the element, and especially wherein $L_F \geq 5*L_R$ (see above). In the excitation stage the pulse generator may provide a radio frequency pulse to the target region, especially wherein the radio frequency pulse is selected to excite the element resulting in a transverse magnetization of the element. In the measurement stage the sensor may detect a signal from the element at an echo time TE after the radio frequency pulse, especially wherein the echo time TE is smaller than a transverse relaxation time, especially a transverse relaxation time T2, or especially an observed transverse relaxation time T2*, of the element in the target region.

In embodiments, the system may be configured to (in an operational mode) execute the method of the invention. In particular, the control system may be configured to (in an operational mode) have the system execute the method of the invention.

In specific embodiments, the invention provides a system for performing a magnetic resonance measurement of an element in a target region of a measurement subject, the system comprising a pulse generator, a control system, a sensor, and a measurement site configured for hosting the measurement subject, wherein the element has a magnetic resonance excitation spectrum peak with a linewidth $L_R$, wherein in an operational mode the (control) system is configured to execute a measurement cycle, wherein: the pulse generator provides a plurality of (successive) pulses of first radiation to the target region, wherein the plurality of pulses are selected to provide a net pulse having a net pulse angle $\alpha_N \leq 1°$, and wherein the first radiation comprises a first frequency spectrum peak having a first width $L_F$, wherein the first frequency spectrum peak at least partially overlaps with the magnetic resonance excitation spectrum peak, and wherein $L_F \geq 5*L_R$; and the pulse generator provides a radio frequency pulse to the target region, wherein the radio frequency pulse is selected to excite the element resulting in a transverse magnetization of the element; and the sensor detects a signal from the element at an echo time TE after the radio frequency pulse, wherein the echo time TE is smaller than an observed transverse relaxation time T2* or transverse relaxation time T2 of the element in the target region.

In embodiments, the system may comprise a pulse generator. The term "pulse generator" may herein refer to any device suitable to provide a radio frequency (or "capable of providing radiation having a frequency") in the magnetic resonance excitation spectrum peak of the element, such as in the magnetic resonance excitation spectrum peak of hydrogen. In particular, the pulse generator may comprise a device selected from the group comprising a control unit, an oscillator system, an RF-pulse generator and an RF-power amplifier.

In embodiments, the system may comprise a control system. The control system may especially be configured to control the system, especially one or more, such as all, of the pulse generator and the sensor.

In embodiments, the system may comprise a sensor. The term "sensor" may herein refer to any sensor device suitable to detect a signal from the element, especially a signal related to transverse or longitudinal magnetization of the element, especially a signal related to transverse magnetization of the element. In particular, the sensor may (be configured to) detect a radio frequency signal emitted by the element. In further embodiments, the sensor may comprise a sensor device selected from the group comprising RF-receiver coils, pre-amplifiers, digitizers and associated control units.

The system may, in embodiments, comprise a measurement site configured for hosting the measurement subject. The measurement site may especially be configured such that the target region (of the measurement subject) may be brought into a functional arrangement with the pulse generator and the sensor. In embodiments, the measurement site may be configured (at least partially) moveable relative to the pulse generator and/or the sensor.

In specific embodiments, the measurement site may be configured for hosting an animal, especially a human. In particular, the measurement site may be configured for hosting the animal in a recumbent position.

Hence, in embodiments, the measurement subject may especially be a human.

In embodiments, the operational mode may comprise executing a plurality of (successive) measurement cycles.

In embodiments, the system may further comprise a magnetic field generator. In such embodiments, in the operational mode, the system, especially the magnetic field generator, may impose a main magnetic field onto the target region. The main magnetic field may have a magnetic flux density selected from the range of 0.2-14 T, especially from the range of 1.5-7 T. In further embodiments, the main magnetic field may have a magnetic flux density of at least 0.2 T, such as at least 0.3 T, especially at least 0.5 T, such as at least 1 T, especially at least 2 T, such as at least 3 T. In further embodiments, the main magnetic field may have a magnetic flux density of at most 10 T, such as at most 7 T, especially at most 5 T, such as at most 3 T, especially at most 2 T, such as at most 1 T.

In further embodiments, in the operational mode the magnetic field generator may superimpose magnetic field gradients onto the main magnetic field. In further embodiments, the magnetic field gradients may have independently selected magnetic flux density gradients of at most 300 mT/m, such as at most 100 mT/m, especially at most 50 mT/m, such as at most 10 mT/m, especially at most 1 mT/m. In further embodiments, the magnetic field gradients may have independently selected magnetic flux densities of at least 0.1 mT/m, such as at least 0.1 mT/m, especially at least 1 mT/m, such as at least 10 mT/m, especially at least 50 mT/m.

In embodiments, the system may comprise a nuclear magnetic resonance system. In further embodiments, the system may comprise an MRI system, especially wherein the measurement site is configured for hosting (at least part of) a human body. In further embodiments, the system may comprises a functional magnetic resonance imaging (fMRI) system.

In a further aspect, the invention may provide a computer program product. The computer program product may comprise program instructions for execution on a control system functionally coupled to a nuclear magnetic resonance system, especially the system according to the invention. Especially, the instructions, when executed by the control system, may cause the nuclear magnetic resonance system to carry out the method of the invention.

In a further aspect, the invention may provide a computer program product comprising program instructions for execution on a control system, especially a control system functionally coupled to a nuclear magnetic resonance system. The instructions, when executed by the control system, may cause the control system to analyze a signal obtainable with the method according to the invention.

In embodiments, the instructions, when executed by the control system, may cause the control system to localize neuronal activity in an animal brain based on a signal obtainable with the method of the invention.

In further embodiments, the control system may suggest a follow-up action for the animal based on the localized neuronal activity, especially a follow-up selected from the group comprising a diet, a drug regime, an exercise regime and a medical treatment.

In a further aspect, the invention may provide a data carrier carrying thereupon program instructions which, when executed by a control system functionally coupled to a nuclear magnetic resonance system, such as the system according to the invention, cause the nuclear magnetic resonance system to carry out the method according to the invention.

The invention may herein, for explanatory purposes, primarily be described in the context of fMRI. However, it will be clear to the person skilled in the art that the invention is not limited to such embodiments. The method may, for example, generally be applied to study systems with two or more compartments with different magnetization transfer rates, especially when one or more of the two or more compartments may undergo a volume change. For example, the method could be applied in the context of plant characterization, such as seed characterization.

The embodiments described herein are not limited to a single aspect of the invention. For example, an embodiment describing the method may, for example, further relate to the system, especially to the operational mode, or especially to the control system. Similarly, an embodiment of the system describing measurement site may further relate to embodiments of the method. In particular, an embodiment of the method describing an operation (of the system) may indicate that the system may, in embodiments, be configured for and/or be suitable for the operation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
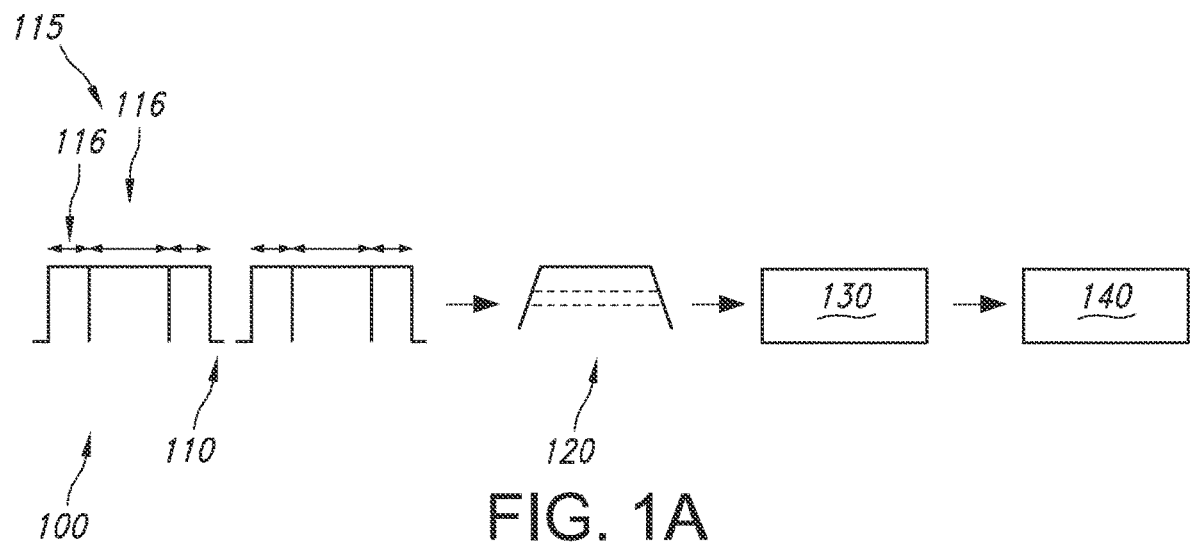
FIGS. 1A-D schematically depict an embodiment of the method of the invention.
Figure 1B:
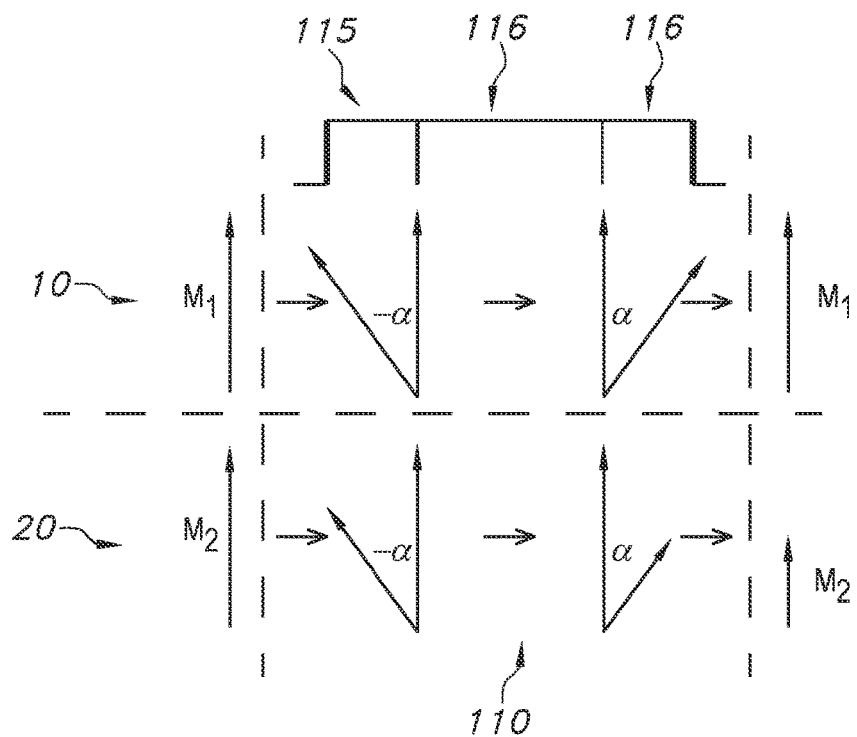

FIGS. 1A-B schematically depict embodiments of the method of the invention. for performing a magnetic resonance measurement of an element in a target region, wherein the element has a magnetic resonance excitation spectrum peak with a linewidth $L_R$.

FIG. 1A schematically depicts a measurement cycle 100 comprising a magnetization transfer stage 110, an excitation stage 130 and a measurement stage 140.

The magnetization transfer stage 110 may comprise providing a plurality of pulses 115 of first radiation to the target region. In the depicted embodiment, the plurality of pulses 115 are selected to provide a net pulse having a net pulse angle $\alpha_N \leq 1°$, especially wherein $\alpha_N = 0$. In particular, in the depicted embodiment the magnetization transfer stage 110 comprises providing two non-selective binomial pulses, with sub-pulses 116, of opposite phases and magnitudes in the proportions $\pm 1/\mp 2/\pm 1$. In embodiments, the first radiation may comprise a first frequency spectrum peak having a first linewidth $L_F$, wherein the first frequency spectrum peak at least partially overlaps with the magnetic resonance excitation spectrum peak, and wherein $L_F \geq 5*L_R$.

The excitation stage 130 may comprise providing a radio frequency pulse to the target region, wherein the radio frequency pulse excites the element resulting in a transverse magnetization of the element.

The measurement stage 140 may comprise detecting a signal from the element. The measurement stage 140 may be temporally arranged at an echo time TE after the radio frequency pulse, especially wherein the echo time TE is smaller than a transverse relaxation time, especially a transverse relaxation time T2, or especially an observed transverse relaxation time T2*, of the element in the target region.

In specific embodiments, the excitation stage 130 and the measurement stage 140 may, together, comprise a multi-echo gradient-echo echo-planar imaging pulse sequence.

In the depicted embodiment, the method further comprises a (pseudo-random) gradient spoiler stage 120. The gradient spoiler stage 120 may especially be temporally arranged between the magnetization transfer stage 110 and the excitation stage 130. The gradient spoiler stage 120 may comprise imposing a (pseudo-random) gradient spoiler scheme (in three directions) onto the target region. The term "pseudo-random" may herein refer to the gradient spoiler schemes of successive gradient spoiler stages (in successive measurement cycles) being selected to avoid systematic effects. For example, if successive gradient spoiler schemes are identical, they may allow some coherence signal pathways to refocus and produce an unwanted signal, in the simplest instance a spin-echo.

FIG. 1A schematically depicts a single measurement cycle 100. In general, in embodiments, the method comprises a plurality of (successive) measurement cycles 100.

FIG. 1B schematically depicts an embodiment of the magnetization transfer stage 110. In particular, the effect of a binomial pulses with angles $-\alpha$, $2\alpha$, $-\alpha$ is shown. The binomial pulse is selected to excite an element in a first pool, especially a free pool, which may undergo magnetization transfer with a (same) element in a second pool, especially a bound pool. Thereby, the binomial pulse may particularly affect the magnetization in the bound pool, which may be rapidly exchanging with the free pool. At the start of the magnetization transfer stage 110 (left side), the magnetization $M_1$ in a first compartment 10 is essentially identical to the magnetization $M_2$ in a second compartment 20. However, the magnetization transfer stage differentially affects the elements in the first compartment 10 and the second compartment 20, especially due to the second compartment comprising a higher proportion of elements in the second pool. In particular, in the first compartment 10, there is little magnetization transfer, and the binomial pulse therefore results in a net pulse of 0° for essentially all excited elements, resulting in $M_1$ after the magnetization transfer stage 110 being essentially the same as $M_1$ prior to the magnetization transfer stage 110. In the second compartment 20 there is, however, a substantial amount of magnetization transfer, resulting in a part of the elements receiving a net pulse angle substantially above 0, resulting in $M_2$ substantially reducing as a result of the magnetization transfer stage 110.

Hence, the plurality of pulses may be selected to provide a net pulse having a net pulse angle $\alpha_N \leq 1°$ (for the free pool).

In exemplary embodiments, the first compartment 10 may be a blood tissue, and the second compartment 20 may be parenchyma. Hence, with the method of the invention, the magnetization of blood may be (essentially) unaffected and is returned to the longitudinal axis with the same value ($M_1$). In the parenchyma there is (substantial) magnetization transfer with the bound pool and the magnetization ($M_2$) is reduced at the end of the binomial pulse with respect to the magnetization ($M_2$) before the binomial pulse.

In embodiments, the plurality of pulses 115 may especially have a pulse duration of at least 0.5 ms, such as at least 0.75 ms, especially at least 1 ms, such as at least 1.5 ms. In further embodiments, the plurality of pulses 115 may especially have a pulse duration of at least 3 ms, such as at least 5 ms, especially at least 6 ms, such as at least 7 ms. In further embodiments, the plurality of pulses 115 may especially have a pulse duration of at most 3 ms, such as at most 2 ms, especially at most 1.5 ms, such as at most 1 ms. In further embodiments, the plurality of pulses 115 may especially have a pulse duration of at most 15 ms, such as at most 12 ms, especially at most 10 ms, such as at most 7 ms. Hence, the sub-pulses 116 of the plurality of pulses 115 may, in embodiments, together have a pulse duration selected from the range of 0.5-15 ms.

Figure 1C:
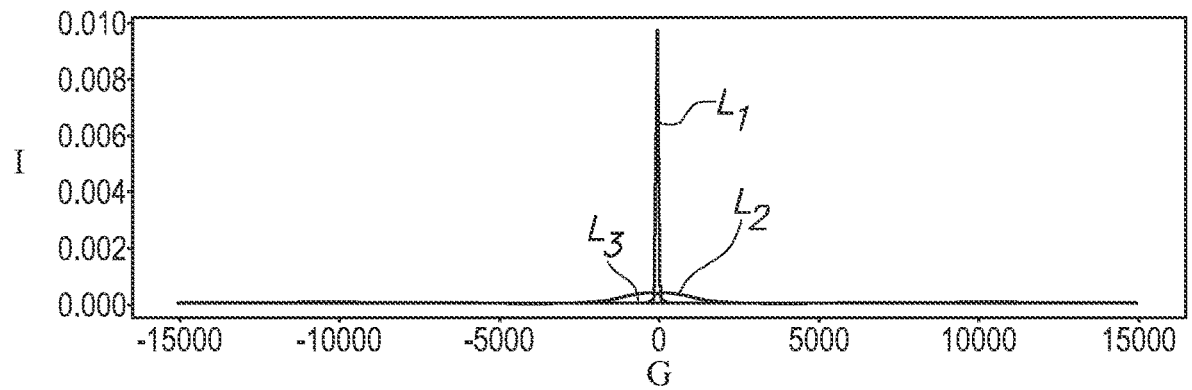
Figure 1D:
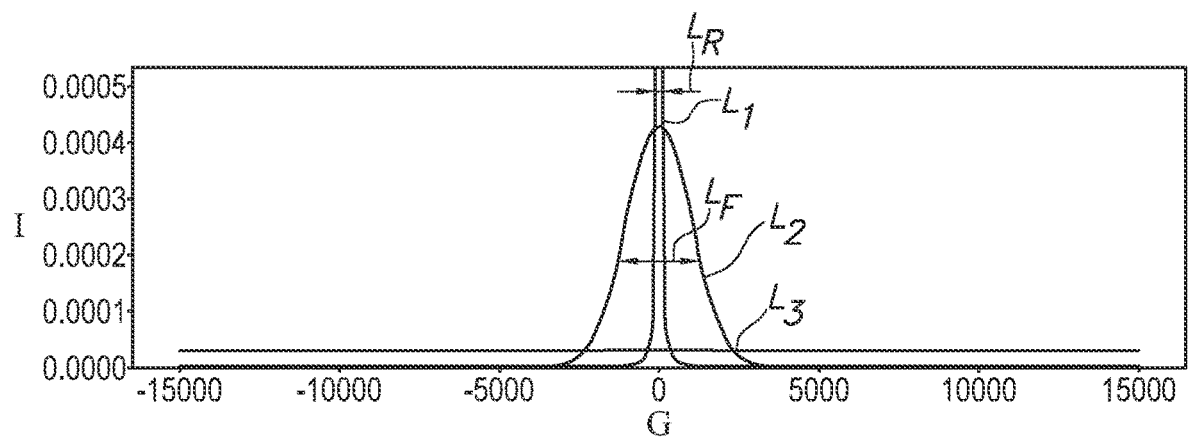

FIGS. 1C-D schematically depict an embodiment of the method, wherein FIG. 1D is a zoomed in version of FIG. 1C. FIGS. 1C-D depict three spectra of intensity I (in a.u.) versus frequency G (in Hz), each normalized to an integral of 1. In particular, line $L_1$ indicates the magnetic resonance excitation spectrum peak of the element in water, especially in blood and tissue; line $L_2$ indicates the first frequency spectrum peak, and line $L_3$ indicates the magnetic resonance excitation spectrum peak of the element in macromolecules of the tissue, such as protein chains. For visualization purposes, $L_3$ is represented as a horizontal line to illustrate its broad linewidth; it will, however, be clear to the person skilled in the art that the linewidth is finite, and that the spectrum will have some structure. In the depicted embodiment, the first frequency spectrum peak at least partially overlaps with the magnetic resonance excitation spectrum peak. In particular, in the depicted embodiment. the first frequency spectrum peak is centered at the same frequency as the magnetic resonance excitation spectrum peak, i.e., centered at the Larmor frequency $\omega_L$ of the element.

FIG. 1D schematically depicts that the element has a magnetic resonance excitation spectrum peak with a linewidth $L_R$, especially at full width half maximum (FWHM). Similarly, the first frequency spectrum peak has a linewidth $L_F$, especially at FWHM, wherein $L_F \geq 5*L_R$.

Figure 2:
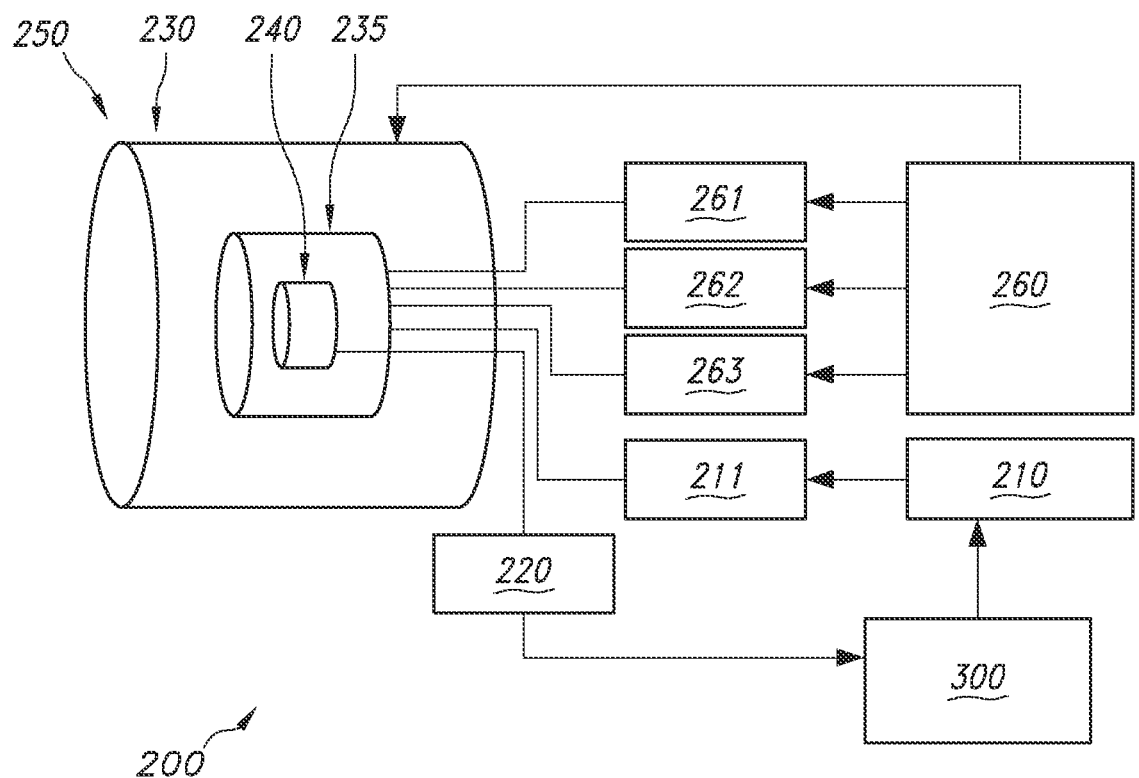
FIG. 2 schematically depicts an embodiment of the system of the invention.

FIG. 2 schematically depicts an embodiment of the system 200 for performing a magnetic resonance measurement of an element in a target region of a measurement subject. The system 200 comprises a pulse generator 210, a control system 300, a sensor 220, and a measurement site 250 configured for hosting the measurement subject.

In embodiments, the pulse generator 210 may comprise or be functionally coupled to an RF coil 240. Hence, in embodiments, the system may comprise an RF coil 240.

In an operational mode the system 200 is configured to execute a measurement cycle 100. The measurement cycle 100 may comprise a magnetization transfer stage 110, an excitation stage 130, and a measurement stage 140. In embodiments, the operational mode may comprise executing a plurality of measurement cycles 100.

In the magnetization transfer stage 110, the pulse generator 210 may provide a plurality of pulses 115 of first radiation to the target region, wherein the plurality of pulses 115 are selected to provide a net pulse having a net pulse angle $\alpha_N \leq 1°$. In embodiments, the first radiation comprises a first frequency spectrum peak having a first width $L_F$, wherein the first frequency spectrum peak at least partially overlaps with the magnetic resonance excitation spectrum peak, and wherein $L_F \geq 5*L_R$.

In the excitation stage 130, the pulse generator 210 may provide a radio frequency pulse to the target region, wherein the radio frequency pulse is selected to excite the element resulting in a transverse magnetization of the element.

In the measurement stage 140, the sensor 220 may detect a signal from the element at an echo time TE after the radio frequency pulse, wherein the echo time TE is smaller than a transverse relaxation time of the element in the target region.

In embodiments, the system 200 may further comprise a magnetic field generator 260. In the operational mode the magnetic field generator 260 may (be configured to) impose a main magnetic field onto the target region, especially via a main magnet 230. Hence, the system 200 may comprise a main magnet 230 functionally coupled with the magnetic field generator 260. In embodiments, the main magnetic field may have a magnetic flux density of at least 0.2 T.

In embodiments, the system 200 may comprise an X-gradient amplifier 261 functionally coupled to the magnetic field generator 260. In further embodiments, the system 200 may comprise a Y-gradient amplifier 262 functionally coupled to the magnetic field generator 260. In further embodiments, the system 200 may comprise a Z-gradient amplifier 263 functionally coupled to the magnetic field generator 260. In further embodiments, the system 200 may comprise a gradient coil 235 functionally coupled to one or more of the magnetic field generator 260, the X-gradient amplifier 261, the Y-gradient amplifier 262, and the Z-gradient amplifier 263, especially to the magnetic field generator 260, or especially to the X-gradient amplifier 261, the Y-gradient amplifier 262, and the Z-gradient amplifier 263.

In further embodiments, in the operational mode the magnetic field generator 260 may superimpose magnetic field gradients onto the main magnetic field. The magnetic field gradients may have independently selected magnetic flux densities of at most 300 mT/m.

In embodiments, the measurement cycle 100 may further comprise a gradient spoiler stage 120. In the gradient spoiler stage 120, the magnetic field generator may impose a (pseudo-random) gradient spoiler scheme (in three directions) onto the target region.

In embodiments, the system 200 may comprise an MRI system, especially wherein the measurement site 250 is configured for hosting at least part of a human body. In further embodiments, The system 200 may comprise a functional magnetic resonance imaging fMRI system.

Experiments

A set of experiments were performed using a multi-echo gradient-echo echo-planar imaging (EPI) pulse sequence with and without a magnetization transfer stage (MT). The two experiments are referred to as MT-on and MT-off. All other parameters were kept constant between the sets of experiments.

The experiments were performed with 16 human subjects using a simple visual stimulus paradigm as described in the Methods below.

Methods

To compare the multi-echo gradient-echo (ME-GE) EPI experiments with and without MT in terms of sensitivity, a typical EPI pulse sequence was modified.

Magnetization Transfer Stage

To suppress the tissue signal, a net 0° on-resonance MT preparation block was implemented into the multi-echo EPI. The MT preparation block consisted of two non-selective binomial RF pulses of opposite phases and magnitudes in the proportions ±1/∓2/±1 (6 ms) and was followed by a pseudo-random gradient spoiler scheme (3 ms) in all three directions. To achieve a constant steady state of continuous tissue suppression, the MT-block was played out before each excitation.

Scanning Protocols

The MT-pulse angle was adjusted empirically to maximally attenuate grey matter signal while restricting attenuation of cerebrospinal fluid (as a proxy for a blood signal) to less than 10%.

Data were acquired on a Siemens MAGNETOM Prisma (3T) MRI scanner with a 32-channel head coil. The acquisition was based on a multi-echo gradient-echo EPI with MT-on and MT-off (also "BOLD") conditions. In the MT-on condition, the MT-block was implemented as explained above whereas, in the MT-off condition, the RF-pulse of the MT-block was turned off while the timing conditions remained the same. The MT flip angle for the MT-on acquisition was ±77°/∓154°/±77°. For both conditions, we acquired multi-echo data at echo times TE=6.9/18/28 ms. The first echo time was chosen to be as short as possible with the measurement setup. The upper limit was chosen to ensure that a strong standard BOLD signal would be recorded.

The acquisition protocol for the ME GE-EPI had the following parameters: in-plane resolution 3 mm isotropic and 38 slices without a gap for a coverage of 12 cm, FOV 80×80, and fat saturation performed before each RF excitation. The flip angle for RF excitation was based on the Ernst angle of grey-matter. Additional parameters are reported in the table below, wherein iPAT: In-plane Parallel Imaging acceleration factor, TR: repetition time, TE: echo times, rBW: readout bandwidth, FA: flip angle, and PF: partial fourier factor:

|    | iPAT | TR(ms) | TE(ms)   | rBW (Hz/px) | FA  | PF  |
|----|------|--------|----------|-------------|-----|-----|
| ME | 3    | 2000   | 6.9/18/28 | 2718       | 50° | 6/8 |

Anatomical scans were acquired for image registration using a sagittal 1 mm isotropic MP-RAGE with: TR of 2300 ms, TI of 900 ms, TE of 3 ms, FA 9°, turbo factor 16 and an in-plane acceleration factor of 2. The total acquisition time was 5:20 min. All imaging sequences were automatically aligned using an auto-align localizer sequence.

Data Acquisition

ME-GE EPI data were acquired from 16 subjects (10M/6F 26±6 years). The subjects were shown a hemifield (R/L) checkerboard flickering at 4 Hz randomly distributed across trials with a block design of [10 s on, 26-32 off ISI]. During the entire task, the subjects were asked to focus on the grey fixation cross in the middle of the screen and press the button box with the R/L index finger whenever the fixation cross changed color using the previous hemifield as a reference for R or L. The total duration of the task was 10 minutes. Stimuli were presented and button presses were recorded. Before performing the task in the scanner, subjects were instructed on a desktop computer located next to the scanning console to guarantee that the procedure was understood. Each subject performed two runs of ten minutes during a session with one MT-on and the other MT-off. The order in which MT-on/off was applied was counterbalanced across subjects.

Functional Processing

Before data preprocessing, DICOMs were converted to NIfTI's using dcm2niix, as described in Li et al. 2016, which is hereby herein incorporated by reference. For each MT-off run, the following preprocessing was performed using the FSL software library. First, head-motion parameters were estimated using a reference volume for BOLD data (transformation matrices, and six corresponding rotation and translation parameters) using MCFLIRT (FSL 5.0.11) as described in Jenkinson et al. 2002, which is hereby herein incorporated by reference. The BOLD data were then co-registered to the T1w reference using FLIRT (FSL 5.0.1), as described in Jenkinson and Smith 2001, which is hereby herein incorporated by reference, with the boundary-based registration cost-function as described in Greve and Fischl, 2009, which is hereby herein incorporated by reference. Co-registration was configured with nine degrees of freedom to account for distortions remaining in the BOLD reference. The BOLD data were resampled to generate preprocessed BOLD data in standard space, as described in Fonov et al. 2011, which is hereby herein incorporated by reference. These were smoothed with a 6 mm kernel and high pass filtered with a cut-off frequency of $1/100$ s. The three echoes in MT-on and MT-off conditions were also averaged.

Data Analysis

MT-on and MT-off images were analyzed using FSL 6.0.1 to find the activation in: (1) right visual cortex for left hemifield, (2) left visual cortex for right hemifield and (3) their combination for both hemifields. The datasets were analyzed using FSL FEAT, as described in Woolrich et al. 2001, to estimate the activation during the checkerboard task for all subjects and for both conditions. The design matrix for the single-subject FEAT analysis modelled three explanatory variables (EV): (1) right hemifield trials vs. baseline, (2) left hemifield vs. baseline and finally (3) overlapping effects from right and left hemifield (R+L); each was convolved with a hemodynamic response and constant term. Additionally, three contrasts were set up, one contrast e.g., [1 0 0] ] for each EV.

A second-level analysis was then carried out, with FEAT, using mixed and fixed-effects. In the fixed-effect analysis, whole-brain data from multiple subjects can be statistically analyzed simply by concatenating time courses. In the mixed-effects analysis, a design matrix is created that allows explicit modeling of both within- and between-subject variance components, as described in Beckmann et al., 2003, which is hereby herein incorporated by reference.

To make inferences at the group level, a one-sample t-test was performed with fixed and mixed effects to access the difference in z-scores. The z-score maps were thresholded at z>2.3 at (p<0.05, Family wise error (FWE) corrected). The one-sample t-test was conducted by concatenating parameter estimates from each contrast at the single-subject.

Paired t-tests with fixed and mixed effect were performed at the significance of (p<005) to detect statistically significant differences between MT-on and MT-off (at same and different TE).

Figure 3A:
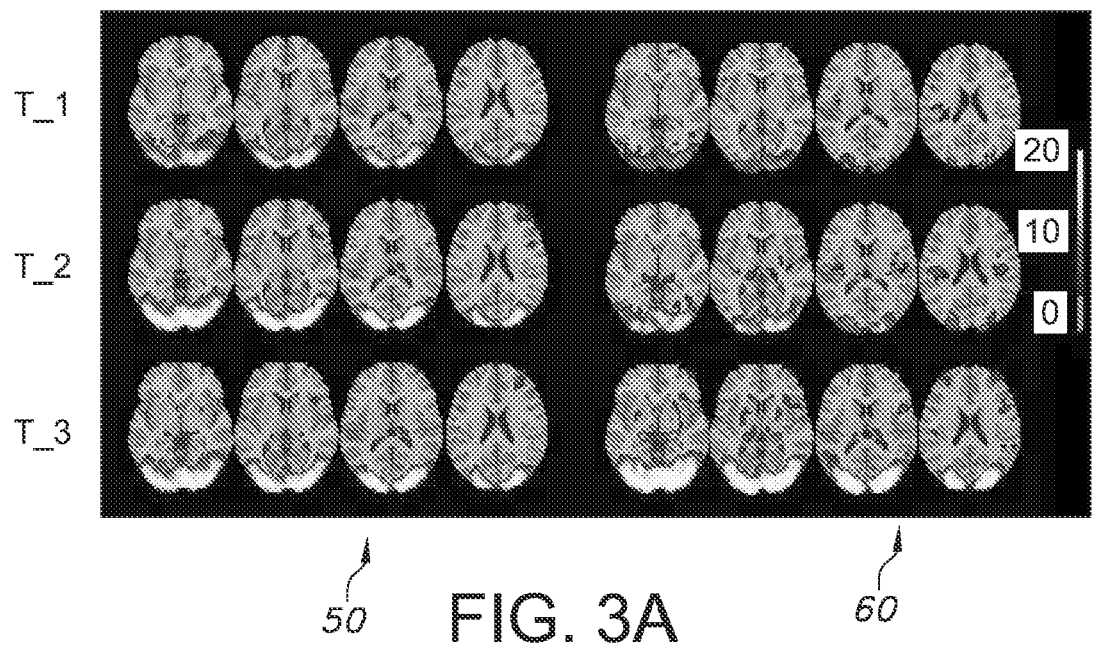
FIGS. 3A-C schematically depict experimental results obtained with the method of the invention and a comparative example.
Figure 3B:
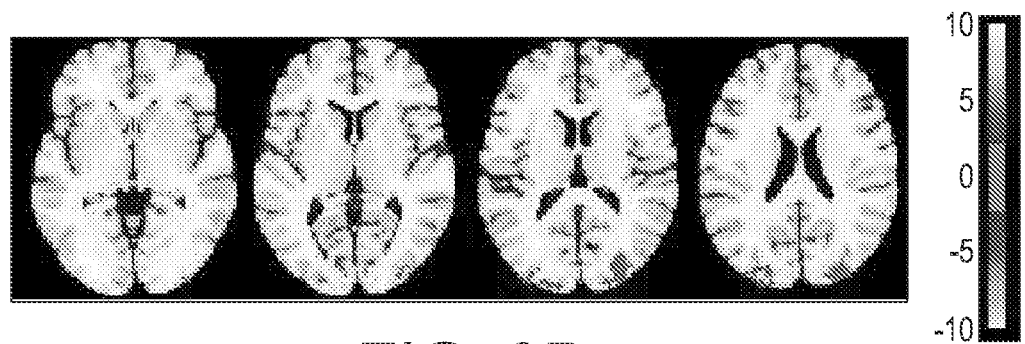
Figure 3C:

FIGS. 3A-C schematically depict fixed effect results.

Specifically, FIG. 3A schematically depicts the fixed effect results for MT-on (left side) and MT-off (right side) for different TE, specifically at TEs: T_1=6.9 ms, T_2=18 ms, and T_3=28 ms. As can be seen, there is an increase in activation with echo time for both MT-on and MT-off as increasing echo time makes the BOLD-effect more prominent. However, at T_1 MT-on provides statistically significant differences with respect to MT-off.

FIGS. 3B-C schematically depict fixed effect group-level visual activation z-score maps shown for (R+L) obtained from the paired t-test at (p<0.05). The results were masked with BOLD contrast at MT-off at T_3 to exclude irrelevant areas.

FIG. 3B schematically depicts the statistically significant differences between MT-on and MT-off at T_1, indicating there are clusters of activation visible specifically with the method of the invention.

FIG. 3C schematically depicts the statistically significant differences between MT-on and MT-off when both are averaged over T_1, T_2 and T_3, indicating that the method of the invention shows a statistically significant cluster of activation within the visual cortex.

Figure 4A:
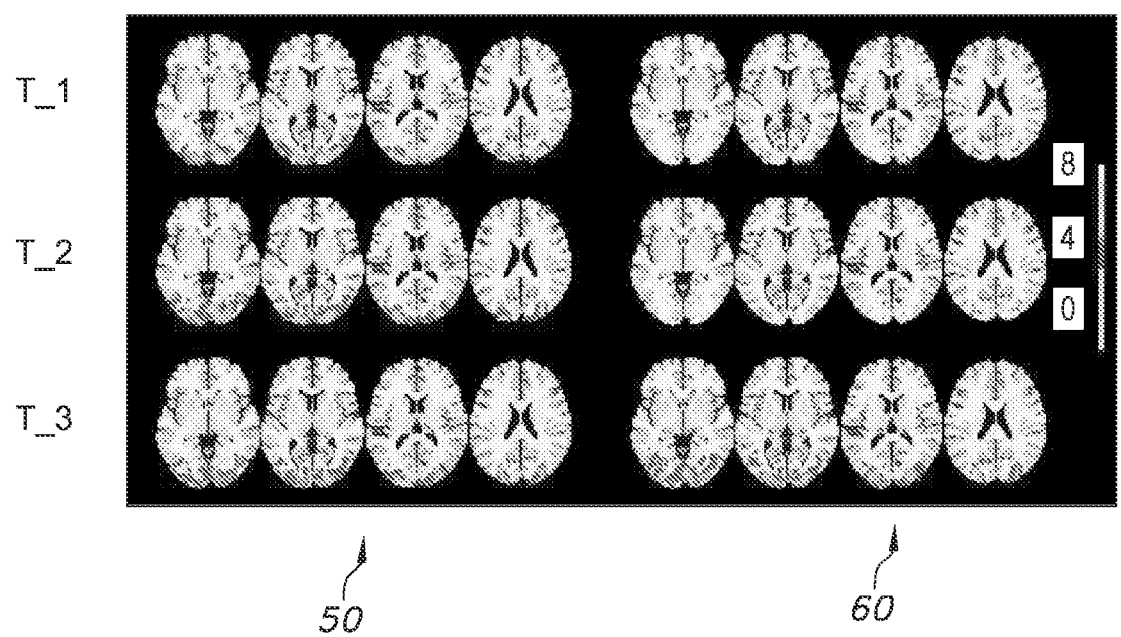
FIGS. 4A-B schematically depict further experimental results obtained with the method of the invention.
Figure 4B:
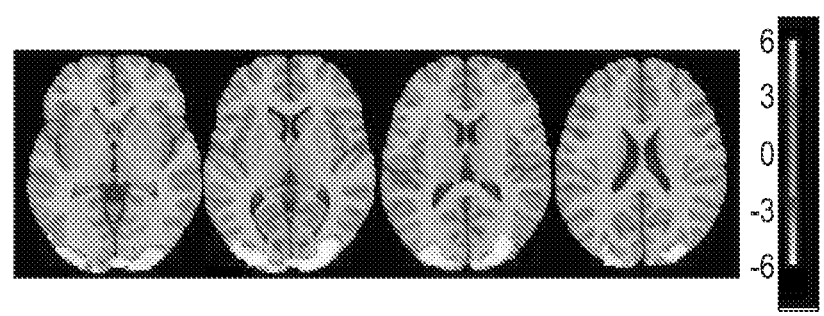

FIGS. 4A-B schematically depict mixed effect results.

Specifically, FIG. 4A schematically depicts the mixed effect results for MT-on (left side) and MT-off (right side) for different TE, specifically at TEs: T_1=6.9 ms, T_2=18 ms, and T_3=28 ms. At all echo times activation is detected with MT-on, whereas there is no statistically relevant activation for MT-off except at T_3, which is indicative of BOLD contrast. Hence, the method of the invention may show brain activation at a shorter TE than BOLD.

FIG. 4B schematically depicts the statistically significant differences between MT-on and MT-off at T_1, indicating that the method of the invention detects statistically significant voxel activation in the virtual cortex at short TE.

The experiments describe above exemplify an additional underlying contrast mechanism that differs from BOLD. This is primarily based on the way in which the statistical maps vary as a function of TE: for standard BOLD the z-scores increase with TE as expected, with the maximum recorded at TE=28 ms, whereas with MT-on a distinctly different pattern is observed (also see FIG. 5B), especially at low TE.

Figure 5A:
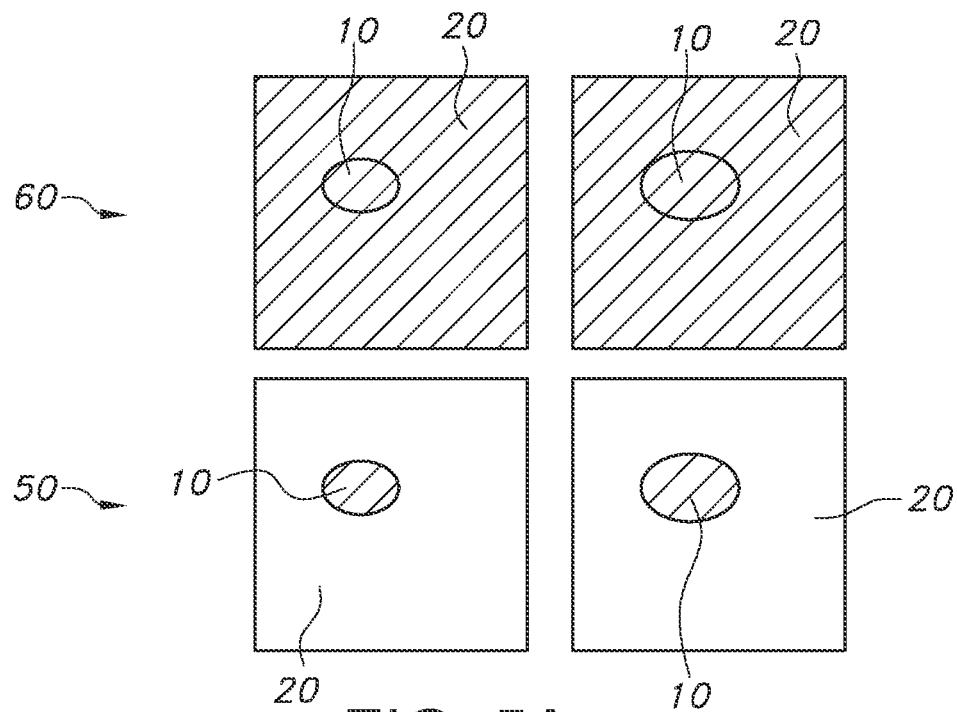
FIGS. 5A-B schematically depict further experimental results obtained with the method of the invention. The schematic drawings are not necessarily to scale.

FIG. 5A schematically depicts the effect of the method of the invention. In particular, it depicts the first compartment 10 and the second compartment 20 in four scenarios, wherein the first compartment 10 either changes in size (right) or not (left), for example, in the context of fMRI, due to local brain activation, and wherein the first compartment 10 and the second compartment are exposed to MT-ON conditions, indicated by reference number 50, or exposed to MT-OFF conditions, indicated by reference number 60. As depicted, when exposed to MT-ON conditions, the signal of the second compartment 20, for example the parenchyma, is repressed, which enables identification of the size change of the first compartment, such as an increase in blood (vessel) volume in the context of fMRI.

Figure 5B:
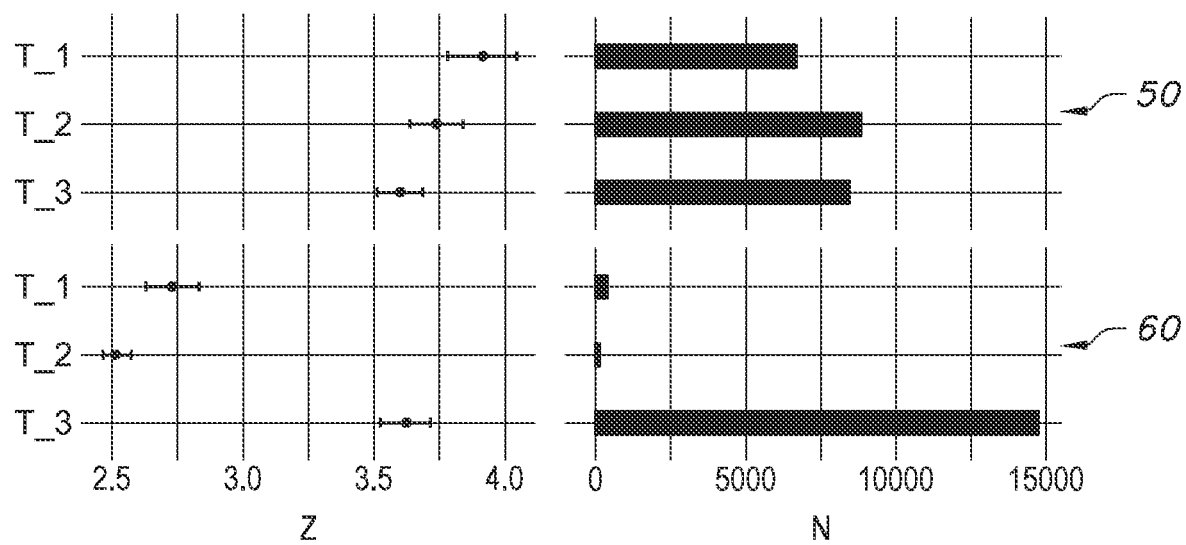

FIG. 5B schematically depicts further experimental results obtained with the method of the invention. In particular, FIG. 5 depicts the mean z-scores (left) and the number N of activated voxels (right) for above-described experiments for MT-on (top three rows) and MT-off (bottom three rows) at T_1, T_2, and T_3. In particular, the FIG. 5 depicts that the method of the invention facilitates the measuring of brain activity at T_1 and T_2, while at least maintaining the performance at T_3 as provided by MT-off.

Hence, the method of the invention enables measuring brain activation with high sensitivity at lower TE than conventional methods.

The term "plurality" refers to two or more. Furthermore, the terms "a plurality of" and "a number of" may be used interchangeably.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%. Moreover, the terms "about" and "approximately" may also relate to 90% or higher, such as 95% or higher, especially 99% or higher, even more especially 99.5% or higher, including 100%. For numerical values it is to be understood that the terms "substantially", "essentially", "about", and "approximately" may also relate to the range of 90%-110%, such as 95%-105%, especially 99%-101% of the values(s) it refers to.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

The term "further embodiment" and similar terms may refer to an embodiment comprising the features of the previously discussed embodiment, but may also refer to an alternative embodiment.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", "include", "including", "contain", "containing" and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The term "controlling" and similar terms herein especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system. The control system and the element may thus at least temporarily, or permanently, functionally be coupled. The element may comprise the control system. In embodiments, the control system and the element may not be physically coupled. Control can be done via wired and/or wireless control. The term "control system" may also refer to a plurality of different control systems, which especially are functionally coupled, and of which e.g. one control system may be a control system and one or more others may be slave control systems.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings. Moreover, if a method or an embodiment of the method is described being executed in a device, apparatus, or system, it will be understood that the device, apparatus, or system is suitable for or configured for (executing) the method or the embodiment of the method respectively.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

CITED LITERATURE

Beckmann et al., "General multilevel linear modeling for group analysis in FMRI", NeuroImage 20 (2003) 1052-1063.
Fonov et al., "Unbiased average age-appropriate atlases for pediatric studies", NeuroImage 54 (2011) 313-327.
Greve and Fischl, "Accurate and robust brain image alignment using boundary-based registration", NeuroImage 48 (2009) 63-72.
Jenkinson and Smith, "A global optimisation method for robust affine registration of brain images", Medical Image Analysis 5 (2001) 143-156.
Jenkinson et al., "Improved Optimization for the Robust and Accurate Linear Registration and Motion Correction of Brain Images", NeuroImage 17, 825-841 (2002).
Li et al., "The first step for neuroimaging data analysis: DICOM to NIfTI conversion", Journal of Neuroscience Methods 264 (2016) 47-56.
Woolrich et al., "Temporal Autocorrelation in Univariate Linear Modeling of FMRI Data", NeuroImage 14, 1370-1386 (2001).

The invention claimed is:

1. A method for performing a magnetic resonance measurement of an element in a target region, wherein the element has a magnetic resonance excitation spectrum peak with a linewidth $L_R$, wherein the method comprises a measurement cycle (100) comprising:
    irradiating the target region with a plurality of pulses (115) of first radiation, wherein the plurality of pulses (115) are selected to provide a net pulse having a net pulse angle $\alpha_N \leq 1°$, and wherein the first radiation comprises a first frequency spectrum peak having a first linewidth $L_F$, wherein the first frequency spectrum peak at least partially overlaps with the magnetic resonance excitation spectrum peak, and wherein $L_F \geq 5*L_R$, wherein a total pulse power is selected from the range of 2 W/kg-20 W/kg;
    irradiating the target region with a radio frequency pulse, wherein the radio frequency pulse excites the element resulting in a transverse magnetization of the element; and
    a measurement stage (140) comprising detecting a signal from the element at an echo time TE after the radio frequency pulse, wherein the echo time TE is smaller than a transverse relaxation time of the element in the target region.

2. A system (200) for performing a magnetic resonance measurement of an element in a target region of a measurement subject, wherein the element has a magnetic resonance excitation spectrum peak linewidth, the system (200) comprising:
    a pulse generator (210) configured to illuminate the target region with:
        (i) a plurality of pulses of first radiation, wherein the plurality of pulses are selected to provide a net pulse having a net pulse angle $\alpha_N \leq 1°$, and wherein the first radiation comprises a first frequency spectrum peak having a first width $L_F$, wherein the first frequency spectrum peak at least partially overlaps with a magnetic resonance excitation spectrum peak of the element, and wherein $L_F \geq 5*L_R$, wherein a total pulse power is selected from the range of 2 W/kg-20 W/kg; and
        (ii) a radio frequency pulse to the target region, wherein the radio frequency pulse is selected to excite the element resulting in a transverse magnetization of the element; and
    a sensor (220) configured to detect a signal from the element at an echo time TE after the radio frequency pulse, wherein the echo time TE is smaller than a transverse relaxation time of the element in the target region.

3. The method according to claim 1, wherein the net pulse angle $\alpha_N \leq 0.1°$.

4. The method according to claim 1, wherein $L_F \geq 10*L_R$.

5. The method according to claim 1, wherein the transverse relaxation time is an observed transverse relaxation time $T2*$, and wherein the echo time $TE \leq 0.9*T2*$.

6. The method according to claim 1, wherein the method comprises a plurality of measurement cycles (100), and further comprising suppressing magnetization of the element in a first compartment (10) to increase contrast between the first compartment (10) and a second compartment (20).

7. The method according to claim 1, wherein the method comprises imposing a main magnetic field onto the target region, wherein the main magnetic field has a magnetic flux density of at least 1 T and of at most 5 T, and wherein the method comprises superimposing magnetic field gradients onto the main magnetic field.

8. The method according to claim 1, wherein the element comprises hydrogen, and wherein the target region comprises a brain of an animal, wherein the method is for localizing a blood volume change in the target region.

9. The system (200) according to claim 2, wherein the net pulse angle $\alpha_N \leq 0.1°$, $L_F \geq 10*L_R$, wherein the transverse relaxation time is an observed transverse relaxation time T2*, and wherein the echo time TE≤0.9*T2*.

10. The system (200) according to claim 2, wherein the system is configured to execute a plurality of measurement cycles.

11. The system (200) according to claim 2, wherein the system (200) further comprises a magnetic field generator (260), wherein the magnetic field generator (260) is configured to impose a main magnetic field onto the target region, wherein the main magnetic field has a magnetic flux density of at least 0.2 T and of at most 5 T, and wherein in an operational mode the magnetic field generator (260) superimposes magnetic field gradients onto the main magnetic field, wherein the magnetic field gradients have independently selected magnetic flux densities of at most 300 mT/m.

12. The system (200) according to claim 2, wherein the system (200) comprises an MRI system, and further comprising a measurement site (250) configured for hosting at least part of a human body.

13. A non-transitory computer program product comprising program instructions for execution on a control system (300) functionally coupled to a nuclear magnetic resonance system, wherein the program instructions, when executed by the control system (300), cause the nuclear magnetic resonance system to carry out the method according to claim 1.

14. A non-transitory computer program product comprising program instructions for execution on a control system (300), wherein the program instructions, when executed by the control system (300), cause the control system (300) to analyze a signal obtainable with the method according to claim 1.

15. The method according to claim 8, wherein the method comprises subjecting the animal to a stimulus, wherein the stimulus is selected from the group comprising food, a drug, an image, a task, and a tactile stimulus.

16. The method according to claim 8, wherein the method further comprises localizing neuronal activity in the brain based on the signal.

17. The system (200) according to claim 12, wherein the system (200) comprises a functional magnetic resonance imaging (fMRI) system.

18. The method according to claim 16, wherein the method further comprises subjecting the animal to a follow-up action based on the localized neuronal activity, wherein the follow-up action is selected from the group comprising following a diet, a drug regime, an exercise regime and a medical treatment.

* * * * *

UNITED STATES PATENT AND TRADEMARK OFFICE
CERTIFICATE OF CORRECTION

PATENT NO. : 12,174,278 B2  
APPLICATION NO. : 17/997636  
DATED : December 24, 2024  
INVENTOR(S) : Norris Page 1 of 1

It is certified that error appears in the above-identified patent and that said Letters Patent is hereby corrected as shown below:

In the Claims

- In Claim 1, Column 24, Line 10, replace "angle $\alpha_N \leq 1°$," with -- angle $\alpha_N \leq 1°$, --

- In Claim 1, Column 24, Line 15, replace "$L_F \geq 5*L_R$," with -- $L_F \geq 5* L_R$, --

- In Claim 1, Column 24, Line 21, remove "a measure state (140) comprising"

- In Claim 2, Column 24, Line 35, replace "angle $\alpha_N \leq 1°$," with -- angle $\alpha_N \leq 1°$, --

- In Claim 2, Column 24, Line 40, replace "wherein $L_F \geq 5*L_R$," with -- wherein $L_F \geq 5* L_R$, --

- In Claim 4, Column 24, Line 54, replace "wherein $L_F \geq 10*L_R$" with -- wherein $L_F \geq 10* L_R$. --

- In Claim 5, Column 24, Line 57, replace "time $TE \leq 0.9*T2*$." with -- time $TE \leq 0.9 * T2*$. --

- In Claim 9, Column 25, Line 8, replace "angle $\alpha_N \leq 0.1°$," with -- angle $\alpha_N \leq 0.1°$, --

- In Claim 9, Column 25, Line 8, replace "$L_F \geq 10*L_R$, wherein" with -- $L_F \geq 10* L_R$, wherein --

- In Claim 9, Column 25, Line 10, replace "time $TE \leq 0.9*T2*$." with -- time $TE \leq 0.9 * T2*$. --

Signed and Sealed this  
Eighteenth Day of March, 2025

Coke Morgan Stewart  
*Acting Director of the United States Patent and Trademark Office*